(12) United States Patent  (10) Patent No.: US 8,669,971 B2
Hirabayashi  (45) Date of Patent: Mar. 11, 2014

(54) DISPLAY DEVICE AND ELECTRONIC APPARATUS

(75) Inventor: Yukiya Hirabayashi, Tottori (JP)

(73) Assignee: Japan Display West Inc., Chita-Gun, Aichi-Ken (JP)

( * ) Notice: Subject to any disclaimer, the term of this patent is extended or adjusted under 35 U.S.C. 154(b) by 356 days.

(21) Appl. No.: 13/022,845

(22) Filed: Feb. 8, 2011

(65) Prior Publication Data

US 2011/0193832 A1   Aug. 11, 2011

(30) Foreign Application Priority Data

Feb. 9, 2010 (JP) ................ P2010-026237

(51) Int. Cl.
G09G 3/36 (2006.01)

(52) U.S. Cl.
USPC ............................. 345/204; 345/87; 345/100

(58) Field of Classification Search
USPC .................... 345/87, 98–103, 204; 377/64
See application file for complete search history.

(56) References Cited

U.S. PATENT DOCUMENTS

| 5,410,583 | A | 4/1995 | Weisbrod et al. |
| 7,406,147 | B2 * | 7/2008 | Lo et al. ............. 377/64 |
| 2006/0001637 | A1 | 1/2006 | Pak et al. |
| 2007/0296662 | A1 | 12/2007 | Lee et al. |
| 2008/0100560 | A1 * | 5/2008 | Na et al. ............. 345/101 |
| 2012/0032615 | A1 | 2/2012 | Kikuchi et al. |

FOREIGN PATENT DOCUMENTS

| JP | 06-264219 | 9/1994 |
| JP | 07-182891 | 7/1995 |
| JP | 2005-192825 | 7/2005 |
| JP | 2006-024350 | 1/2006 |
| JP | 2008-003602 | 1/2008 |
| WO | 2010137197 | 12/2010 |

OTHER PUBLICATIONS

Japanese Office Action issued Oct. 1, 2013 in a corresponding Japanese Patent Application.

* cited by examiner

*Primary Examiner* — Amare Mengistu
*Assistant Examiner* — Stacy Khoo
(74) *Attorney, Agent, or Firm* — K&L Gates LLP

(57) ABSTRACT

Disclosed herein is a display device including: a switching element configured to be formed for each of pixels; a gate line configured to be connected to the switching element; and a scanning line drive circuit configured to be connected to the gate line.

7 Claims, 9 Drawing Sheets

F I G . 3
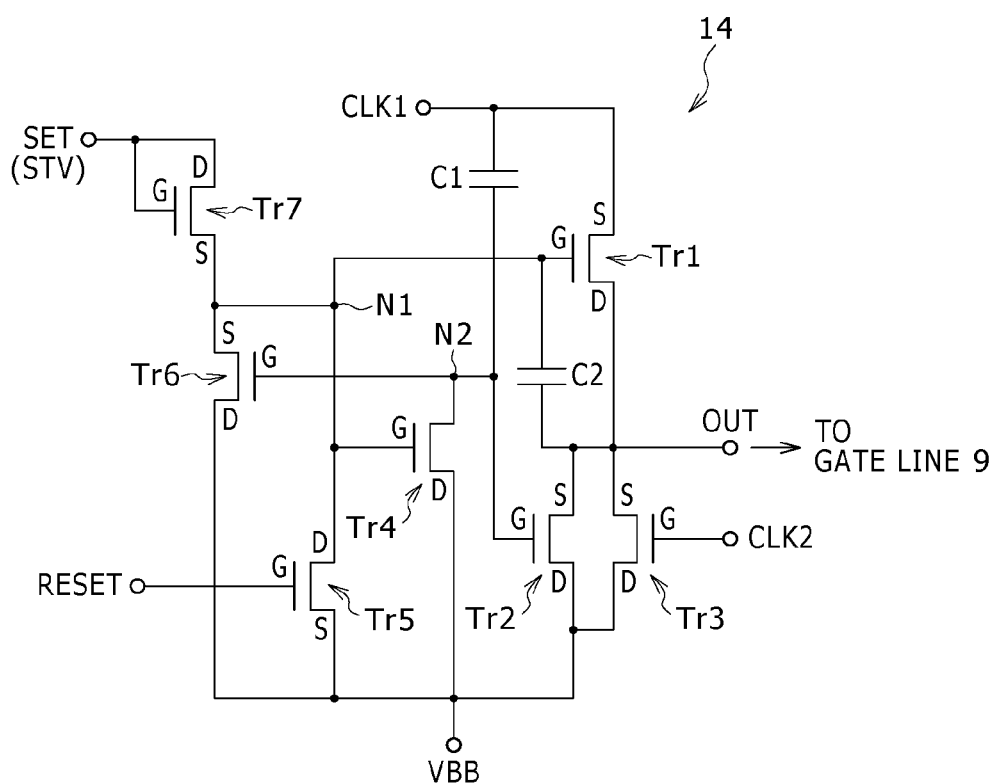

| FIRST EMBODIMENT | | OPTIMUM RANGE | COMPARATIVE EXAMPLE |
|---|---|---|---|
| Tr1 | 100% | 100% | 100% |
| Tr2 | 17%~37% | 17%~20% | 22%~37% |
| Tr3 | 20%~40% | — | 20%~40% |
| Tr4 | 2.5%~6% | 3%~5% | 6%~15% |
| Tr5 | 2.5%~6% | 3%~5% | 6%~15% |
| Tr6 | 2.5%~6% | 3%~5% | 6%~15% |
| Tr7 | 15%~30% | 20%~25% | 6%~15% |

F I G . 7
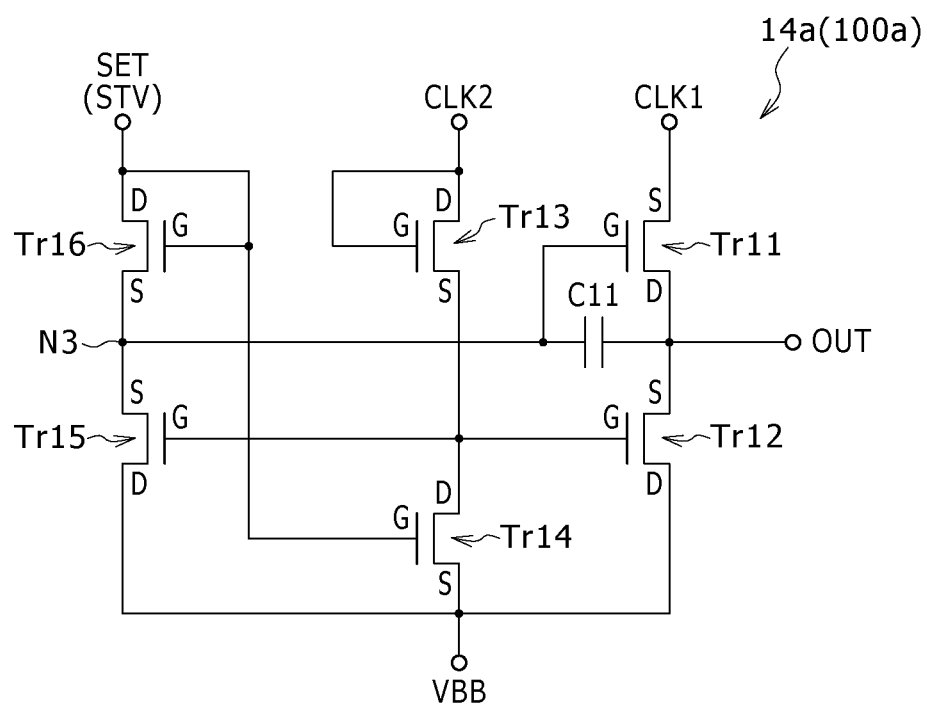

| | SECOND EMBODIMENT | | COMPARATIVE EXAMPLE |
|---|---|---|---|
| | | OPTIMUM RANGE | |
| Tr11 | 100% | 100% | 100% |
| Tr12 | 22%～37% | — | 22%～37% |
| Tr13 | 1%～10% | — | 1%～10% |
| Tr14 | 6%～15% | — | 6%～15% |
| Tr15 | 6%～15% | — | 6%～15% |
| Tr16 | 15%～30% | 20%～25% | 6%～15% |

DISPLAY DEVICE AND ELECTRONIC APPARATUS

CROSS REFERENCES TO RELATED APPLICATIONS

The present application claims priority to Japanese Priority Patent Application No. 2010-026237 filed in the Japan Patent Office on Feb. 9, 2010, the entire content of which is hereby incorporated by reference.

BACKGROUND

The present application relates to display devices and electronic apparatus, and particularly to a display device and electronic apparatus that have a scanning line drive circuit unit including plural transistors.

As related arts, a display device and electronic apparatus that have a scanning line drive circuit unit including plural transistors are known (refer to e.g. Japanese Patent Laid-open No. Hei 7-182891 and Japanese Patent Laid-open No. 2006-24350 (hereinafter, Patent Documents 1 and 2)).

Patent Documents 1 and 2 disclose a display device having a stage (scanning line drive circuit unit) including a first transistor and a second transistor. In this stage, the output signal of the previous stage is input to one of the source and drain of the first transistor and the gate of the first transistor. In addition, the other of the source and drain of the first transistor is connected to the gate of the second transistor, and the second transistor outputs a signal to a gate line from one of its source and drain. In this stage, an H-level signal is input from the previous stage to the gate of the first transistor, and thereby the first transistor enters the on-state, so that the H-level signal of the previous stage is input to the gate of the second transistor. This makes the second transistor enter the on-state, so that a clock signal (H-level signal) connected to the other of the source and drain of the second transistor is output to the output terminal.

SUMMARY

However, regarding the operating performance of the scanning line drive circuit unit in the display device described in Patent Documents 1 and 2, no study is presented about the magnitude of the size ratio (W/L) obtained by dividing the channel width W of the first transistor and the second transistor by the channel length L thereof.

There is a need for the present application to provide a display device and electronic apparatus capable of enhancing the operating performance of a scanning line drive circuit unit through adjustment of the size ratio of a transistor.

According to a first mode of the present application, there is provided a display device including a switching element configured to be formed for each of pixels, a gate line configured to be connected to the switching element, and a scanning line drive circuit configured to be connected to the gate line. The scanning line drive circuit includes scanning line drive circuit units of a plurality of stages. The scanning line drive circuit unit includes a first transistor and a second transistor. One of the source and drain of the first transistor is connected to the gate line. An output signal of the scanning line drive circuit unit provided at a previous stage is input to one of the source and drain of the second transistor. The other of the source and drain of the second transistor is connected to the gate of the first transistor. The magnitude of a size ratio obtained by dividing the channel width of the second transistor by the channel length of the second transistor is in the range from 15% to 30% of the magnitude of a size ratio obtained by dividing the channel width of the first transistor by the channel length of the first transistor.

In the display device according to this first mode, as described above, the magnitude of the size ratio obtained by dividing the channel width of the second transistor by the channel length thereof is set in the range from 15% to 30% of the magnitude of the size ratio obtained by dividing the channel width of the first transistor by the channel length thereof. Thereby, for example compared with the case in which the magnitude of the size ratio of the second transistor is smaller than 15% of the magnitude of the size ratio of the first transistor, the magnitude of the signal output from the other of the source and drain of the second transistor can be increased in association with the larger magnitude of the size ratio of the second transistor. Thus, the time necessary for charge/discharge of the parasitic capacitor between the other of the source and drain of the second transistor and the gate of the first transistor can be shortened. Due to this feature, the operating performance of the scanning line drive circuit unit can be enhanced through the adjustment of the size ratio of the transistor. The effect that the operating performance of the scanning line drive circuit unit can be enhanced through the adjustment of the size ratio of the transistor has already been verified by the result of simulation to be described later.

In the display device according to the above-described first mode, it is preferable that the magnitude of the size ratio obtained by dividing the channel width of the second transistor by the channel length of the second transistor be in the range from 20% to 25% of the magnitude of the size ratio obtained by dividing the channel width of the first transistor by the channel length of the first transistor. If such a configuration is employed, the operating performance of the scanning line drive circuit unit can be further enhanced.

In the display device according to the above-described first mode, it is preferable that the scanning line drive circuit unit further include a third transistor connected to the gate of the first transistor and the other of the source and drain of the second transistor, and the magnitude of a size ratio obtained by dividing the channel width of the third transistor by the channel length of the third transistor be smaller than the magnitude of the size ratio obtained by dividing the channel width of the second transistor by the channel length of the second transistor, and be in the range from 2.5% to 6% of the magnitude of the size ratio obtained by dividing the channel width of the first transistor by the channel length of the first transistor. If such a configuration is employed, for example compared with the case in which the magnitude of the size ratio of the third transistor is larger than 6% of the magnitude of the size ratio of the first transistor, the time necessary for charge/discharge of the parasitic capacitor of the third transistor can be shortened in association with the smaller magnitude of the size ratio of the third transistor. Thus, the operating performance of the scanning line drive circuit unit can be enhanced.

In the display device according to the above-described first mode, it is preferable that the scanning line drive circuit unit further include a plurality of third transistors connected to the gate of the first transistor and the other of the source and drain of the second transistor, and the magnitude of a size ratio of each of the plurality of third transistors, obtained by dividing the channel width of a respective one of the third transistors by the channel length of the respective one of the third transistors, be smaller than the magnitude of the size ratio obtained by dividing the channel width of the second transistor by the channel length of the second transistor, and be in the range from 2.5% to 6% of the magnitude of the size ratio obtained by dividing the channel width of the first transistor by the channel length of the first transistor. If such a configuration is employed, also in the case in which the plurality of third transistors are provided, the time necessary for charge/discharge of the parasitic capacitor of each of the plurality of third transistors can be shortened. Thus, the operating performance of the scanning line drive circuit unit can be enhanced.

In the display device including the above-described third transistor, it is preferable that the magnitude of the size ratio obtained by dividing the channel width of the third transistor by the channel length of the third transistor be in the range from 3.0% to 5.0% of the magnitude of the size ratio obtained by dividing the channel width of the first transistor by the channel length of the first transistor. If such a configuration is employed, the operating performance of the scanning line drive circuit unit can be further enhanced.

In the display device according to the above-described first mode, it is preferable that the output signal of the scanning line drive circuit unit provided at the previous stage be input to one of the source and drain of the second transistor and the gate of the second transistor. If such a configuration is employed, due to the input of the output signal (H-level signal) of the scanning line drive circuit unit provided at the previous stage to the gate of the second transistor, the second transistor can be set to the on-state and the H-level signal can be output from the other of the source and drain of the second transistor.

In the display device according to the above-described first mode, it is preferable that the first transistor and the second transistor have an active layer formed of amorphous silicon. Employing such a configuration allows enhancement in the operating performance of the scanning line drive circuit unit including the first transistor and the second transistor that have the active layer formed of amorphous silicon, which is susceptible to performance deterioration.

According to a second mode of the present application, there is provided electronic apparatus including the display device having any of the above-described configurations. Employing such a configuration can achieve electronic apparatus including a display device capable of enhancing the operating performance of the display device through adjustment of the size ratio of the transistor.

Additional features and advantages are described herein, and will be apparent from the following Detailed Description and the figures.

BRIEF DESCRIPTION OF THE FIGURES

FIG. 3 is an equivalent circuit diagram of a V scanner block in the scanning line drive circuit of the first embodiment;

FIG. 7 is an equivalent circuit diagram of a V scanner block in a liquid crystal display device of a second embodiment;

DETAILED DESCRIPTION

Embodiments of the present application will be described below in detail with reference to the drawings.

First Embodiment

Figure 1:
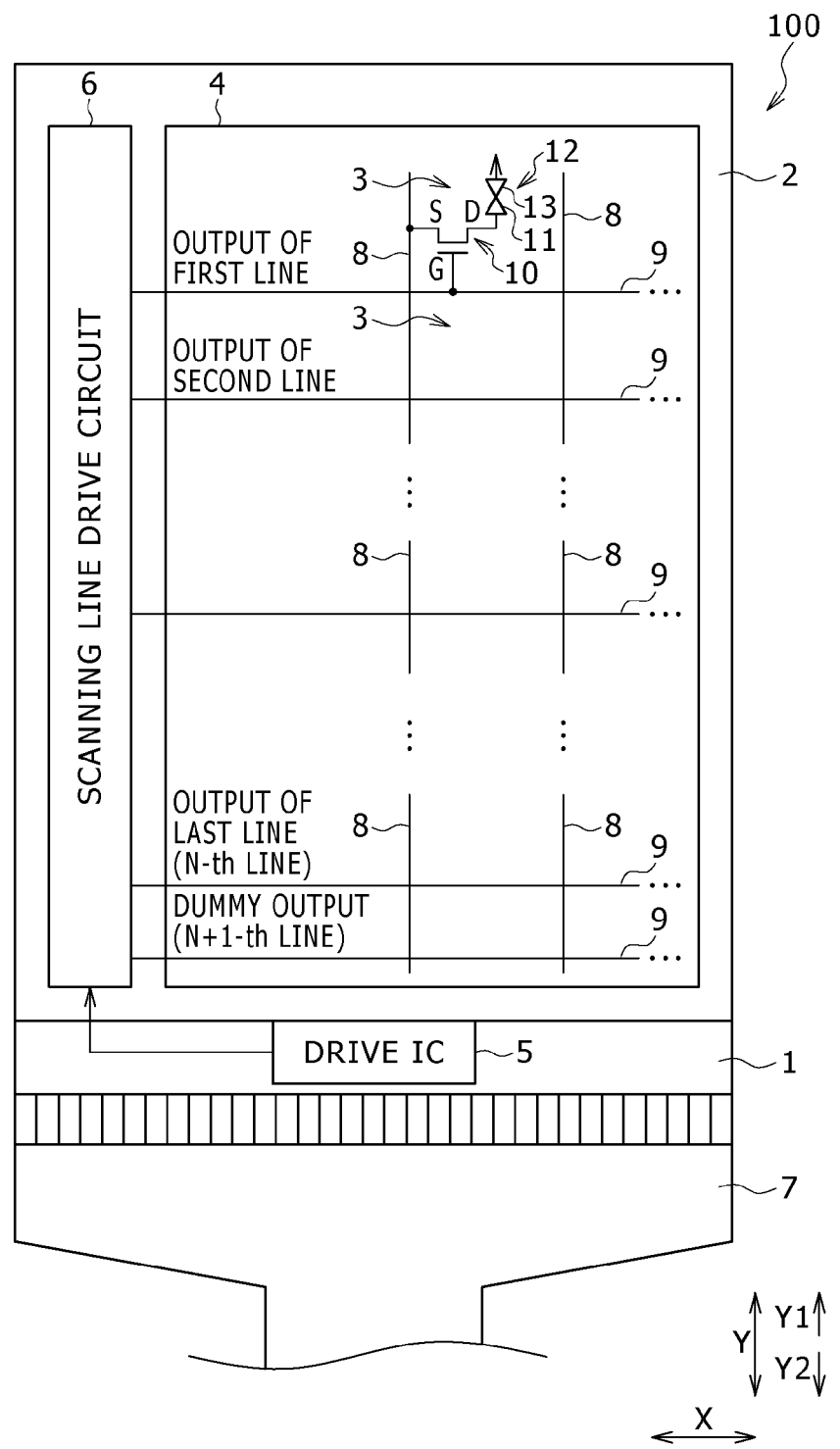
FIG. 1 is a plan view of a liquid crystal display device of a first embodiment.
Figure 2:
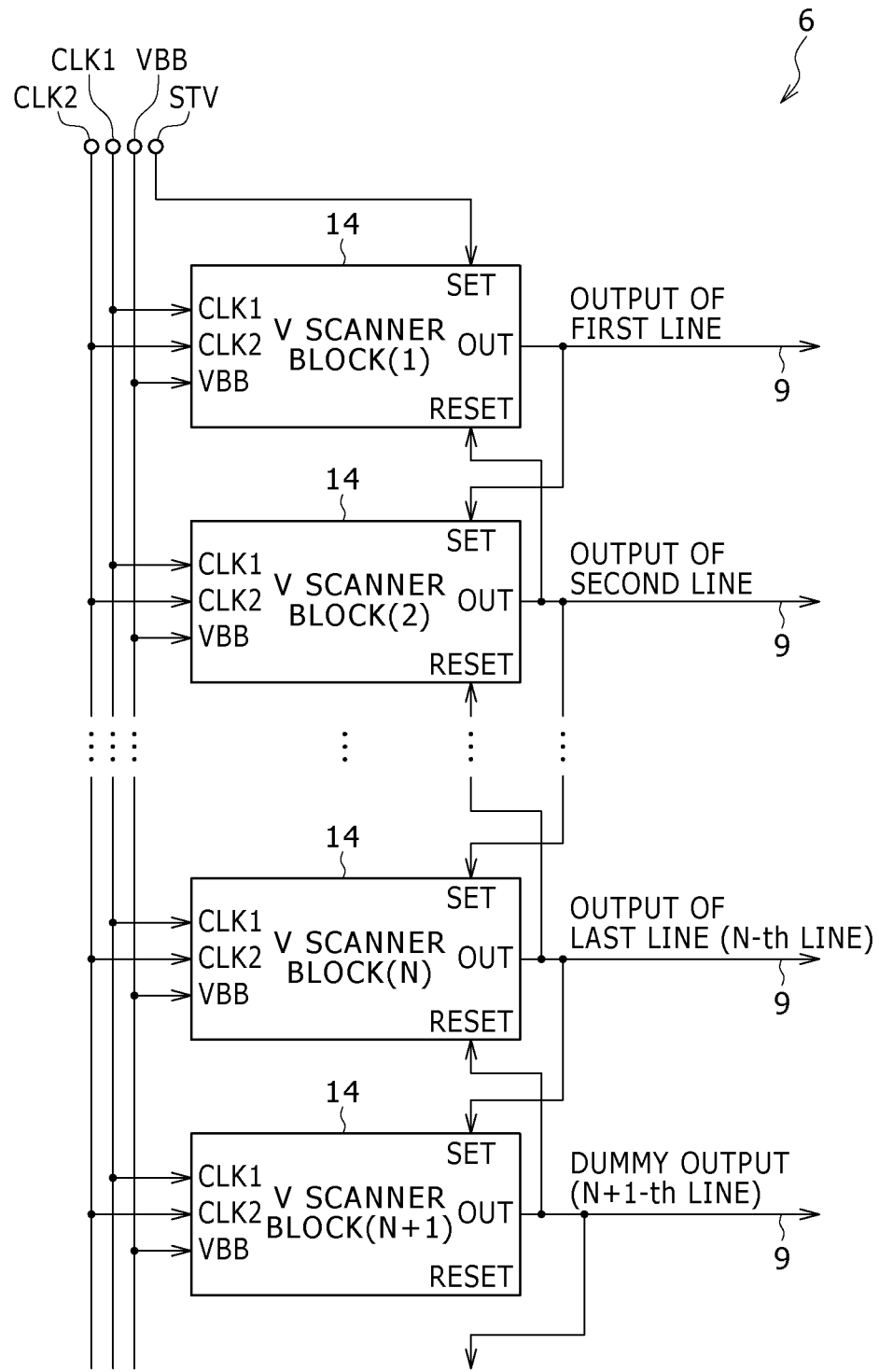
FIG. 2 is a block diagram of a scanning line drive circuit of the first embodiment.

With reference to FIG. 1 to FIG. 3, the configuration of a liquid crystal display device 100 of a first embodiment will be described.

As shown in FIG. 1, the liquid crystal display device 100 of the first embodiment includes a TFT substrate 1 and a counter substrate 2 as a pair of substrates, a display unit 4 including plural pixels 3, a drive IC 5 for driving the liquid crystal display device 100, a scanning line drive circuit 6 provided on the surface of the TFT substrate 1, and a flexible printed circuit (FPC) 7 to output various signals to the drive IC 5. The liquid crystal display device 100 is one example of the "display device" of the embodiments of the present application.

The display unit 4 includes plural data lines 8 extended along the Y-direction and plural gate lines 9 that are so provided as to be substantially perpendicular to the data lines 8 and extended along the X-direction. Each of the plural gate lines 9 is connected to the scanning line drive circuit 6. The plural gate lines 9 are juxtaposed in the Y-direction of the TFT substrate 1 and arranged in the order of the first line, the second line, ..., the N-th line, and the (N+1)-th line in the direction from the Y1-direction side toward the Y2-direction side.

The pixel 3 is provided in the area at the intersection of the gate line 9 and the data line 8. In the pixel 3, a thin film transistor 10 for switching is provided. The thin film transistor 10 is one example of the "switching element" of the embodiments of the present application. The source (S) of the thin film transistor 10 is connected to the data line 8, and the gate (G) of the thin film transistor 10 is connected to the gate line 9. The drain electrode (D) of the thin film transistor 10 is connected to a pixel electrode 11. A counter electrode 13 is so provided as to be opposed to the pixel electrode 11 with the intermediary of a liquid crystal layer 12.

The drive IC 5 is so configured as to generate a VBB potential at the L level, an STV signal (start signal), a pulse CLK1 (clock 1) signal, and a CLK2 (clock 2) signal as the inverted signal of the CLK1 signal, and output these signals to the scanning line drive circuit 6.

As shown in FIG. 2, the scanning line drive circuit 6 includes V scanner blocks 14 of plural stages. The V scanner block 14 is one example of the "scanning line drive circuit unit" of the embodiments of the present application. The V scanner block 14 has a function to output a signal from an OUT terminal and sequentially transfer the signal to the V scanner block 14 of the next stage. The plural V scanner blocks 14 are connected to the first line, the second line, the N-th line, and the (N+1)-th line, respectively, of the gate lines 9. The V scanner block 14 connected to the gate line 9 of the first line is diagrammatically represented as V scanner block (1). The V scanner block 14 connected to the gate line 9 of the second line is diagrammatically represented as V scanner block (2). The V scanner block 14 connected to the gate line 9 of the N-th line is diagrammatically represented as V scanner block (N). The V scanner block 14 connected to the gate line 9 of the (N+1)-th line is diagrammatically represented as V scanner block (N+1).

The V scanner block 14 connected to the gate line 9 of the first line from the scanning line drive circuit 6 includes a CLK1 terminal to which the CLK1 signal is input, a CLK2 terminal to which the CLK2 signal is input, a VBB terminal to which the VBB potential at the L level is input, an SET terminal to which the STV signal is input, the OUT terminal for outputting a signal to the gate line 9, and a RESET terminal to which a signal from the OUT terminal of the V scanner block 14 of the next stage is input. To the SET terminal of the V scanner block 14 connected to the gate line 9 of the second line or a subsequent line, the signal output from the OUT terminal of the V scanner block 14 of the previous stage is input. The other configuration of the V scanner block 14 connected to the gate line 9 of the second line or a subsequent line is the same as that of the V scanner block 14 connected to the gate line 9 of the first line.

As the detailed configuration of the V scanner block 14, as shown in FIG. 3, the V scanner block 14 is composed of seven n-channel transistors (transistor Tr1, transistor Tr2, transistor Tr3, transistor Tr4, transistor Tr5, transistor Tr6, and transistor Tr7) that have an active layer formed of amorphous silicon, and two capacitors (C1 and C2). The transistor Tr1 is one example of the "first transistor" of the embodiments of the present application. The transistor Tr7 is one example of the "second transistor" of the embodiments of the present application. The transistor Tr4, the transistor Tr5, and the transistor Tr6 are one example of the "third transistor" of the embodiments of the present application.

The source (S) of the transistor Tr1 is connected to the CLK1 terminal and the pulse CLK1 signal (clock signal) is input thereto. Furthermore, the source (S) of the transistor Tr1 is connected to one electrode of the capacitor C1. The drain (D) of the transistor Tr1 is connected to the gate line 9 (see FIG. 1) via the OUT terminal.

Furthermore, the drain (D) of the transistor Tr1 is connected to the source (S) of the transistor Tr2, the source (S) of the transistor Tr3, and one electrode of the capacitor C2. The gate (G) of the transistor Tr1 is connected to the gate (G) of the transistor Tr4, the drain (D) of the transistor Tr5, the source (S) of the transistor Tr6, the source (S) of the transistor Tr7, and the other electrode of the capacitor C2.

The drain (D) of the transistor Tr2 is connected to the drain (D) of the transistor Tr3, the drain (D) of the transistor Tr4, the source (S) of the transistor Tr5, the drain (D) of the transistor Tr6, and the VBB terminal. The gate (G) of the transistor Tr2 is connected to the source (S) of the transistor Tr4, the gate (G) of the transistor Tr6, and the other electrode of the capacitor C1. The gate (G) of the transistor Tr3 is connected to the CLK2 terminal and the pulse CLK2 signal (clock signal (inverted signal of the CLK1 signal)) is input thereto.

The gate (G) of the transistor Tr5 is connected to the RESET terminal and the output signal from the OUT terminal of the V scanner block 14 of the next stage is input thereto. The drain (D) of the transistor Tr7 and the gate (G) of the transistor Tr7 are connected to the SET terminal. To the SET terminal of the V scanner block 14 connected to the gate line 9 of the first line, the STV signal (start signal) is input. To the SET terminal of the V scanner block 14 connected to the gate line 9 of the second line or a subsequent line, the output signal from the OUT terminal of the V scanner block 14 of the previous stage is input.

Next, with reference to FIG. 4 and FIG. 5, a description will be made below about simulation on the upper limit of the operating frequency of the V scanner block and the life thereof in the case in which the magnitude of the size ratio (W/L) of the transistor Tr7 in the V scanner block of the first embodiment is changed with respect to the transistor Tr1. In the V scanner block 14 of a comparative example and the first embodiment, the magnitude of the size ratio (W/L) obtained by dividing the channel width W of the transistor Tr1 by the channel length L thereof is defined as 100% (base). The channel width W of the transistor Tr1 in the V scanner block 14 of the comparative example and the first embodiment is about 2 mm (about 2000 μm), and the channel length L thereof is about 4 μm. Furthermore, the size ratio of the transistor Tr7 in the V scanner block 14 of the comparative example to the transistor Tr1 is set in the range from about 6% to about 15%, and the size ratio of the transistor Tr7 in the V scanner block 14 of the first embodiment is set in the range from about 15% to about 30% of the size ratio of the transistor Tr1. In this simulation, for the transistors Tr2 to Tr6, the same size ratios as those of the comparative example shown in FIG. 5 are set. Specifically, the size ratio of the transistor Tr2 is set in the range from about 22% to about 37%. The size ratio of the transistor Tr3 is set in the range from about 20% to about 40%. The size ratio of the transistors Tr4, Tr5, and Tr6 is set in the range from about 6% to about 15%.

Figure 4:
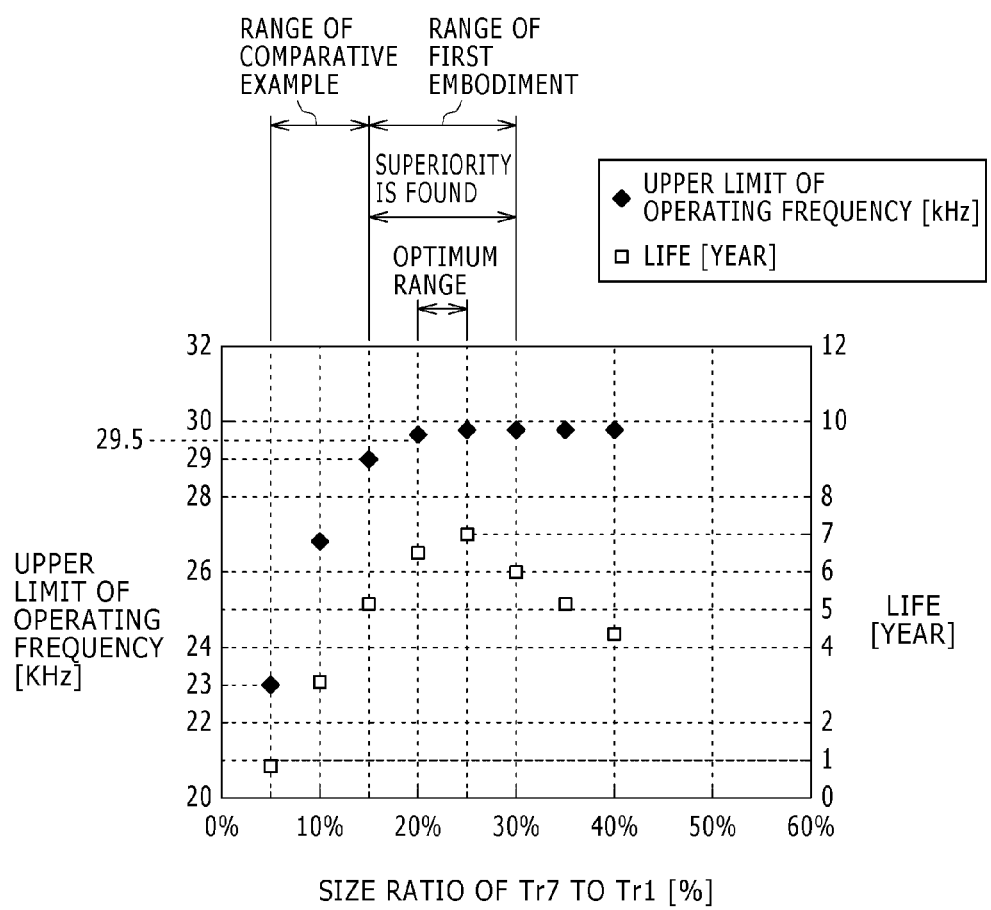
FIG. 4 is a graph showing the upper limit of the operating frequency and the life when the size ratio (W/L) of a transistor in the V scanner block of the first embodiment and a comparative example is changed.
Figures 5, 6:
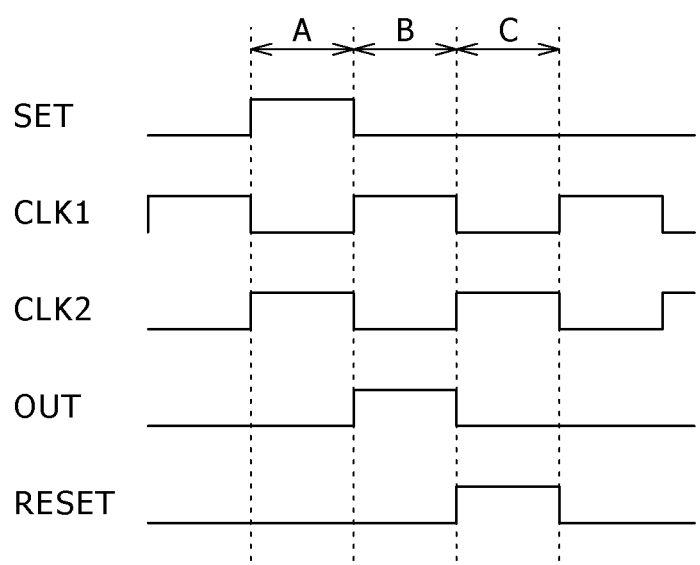
FIG. 5 is a table showing the size ratios (W/L) of the respective transistors in the V scanner block of the first embodiment and the comparative example.
FIG. 6 is a timing chart for explaining the operation of the scanning line drive circuit of the first embodiment.

In FIG. 4, the abscissa indicates the size ratio of the transistor Tr7 to the transistor Tr1 [%], and the ordinate indicates the upper limit of the operating frequency [kHz] and the life [year]. The simulation on the life of the V scanner block 14 is based on the assumption that the liquid crystal display device 100 is used at a temperature of about 70° C. That is, when the liquid crystal display device 100 is used at a temperature of about 30° C., a life longer than those shown in FIG. 4 is obtained.

As shown in FIG. 4, it is found that, when the size ratio of the transistor Tr7 in the V scanner block 14 is in the range from about 6% to about 15% (range of the comparative example), the upper limit of the operating frequency is in the range from about 23 kHz to about 29 kHz. Furthermore, it is found that the life of the V scanner block 14 in the range of the comparative example is in the range from about one year to about five years.

In contrast, it is found that, when the size ratio of the transistor Tr7 in the V scanner block 14 is in the range from about 15% to about 30% (range of the first embodiment), the upper limit of the operating frequency is in the range from about 29 kHz to about 30 kHz. Furthermore, it is found that the life of the V scanner block 14 of the first embodiment is in the range from about five years to about seven years. That is, it is found that the operating frequency can be enhanced by about 1 kHz and the life can be extended by about two years compared with the V scanner block 14 of the comparative example by setting the size ratio of the transistor Tr7 in the V scanner block 14 in the range from about 15% to about 30%.

Moreover, it is found that, when the size ratio of the transistor Tr7 in the V scanner block 14 of the first embodiment is in the range from about 20% to about 25% (optimum range), the upper limit of the operating frequency is in the range from about 29.5 kHz to about 30 kHz. Furthermore, it is found that the life of the V scanner block 14 in the optimum range is from about 6.5 years to about seven years. That is, it is confirmed that the superiority over the comparative example in the operating frequency and the life is large when the size ratio is in the range from about 20% to about 25% within the range from about 15% to about 30%, which is the range of the size ratio of the transistor Tr7 in the V scanner block 14 of the first embodiment.

Next, a description will be made below about simulation in which the size ratio of the transistor Tr2 among the transistors Tr2 to Tr7 is changed. The magnitudes of the size ratio of the transistors Tr3 to Tr6 are the same as those of the comparative example shown in FIG. 5.

In the comparative example, the size ratio of the transistor Tr2 in the V scanner block 14 is in the range from about 22% to about 37% of the size ratio of the transistor Tr1. In contrast, for the transistor Tr2 in the V scanner block 14 of the first embodiment, its size ratio is set in a range wider than that of the comparative example, i.e. the range from about 17% to about 37% of the size ratio of the transistor Tr1. As a result, improvements in the upper limit of the operating frequency and the life from those of the comparative example are not found differently from the above-described case of the transistor Tr7. As for the transistor Tr3, simulation in which the size ratio is changed from that in the comparative example was not carried out.

Next, for the transistor Tr4 (Tr5, Tr6) in the V scanner block 14 of the first embodiment, its size ratio is set in the range from about 2.5% to about 6% of the size ratio of the transistor Tr1, in contrast to the comparative example, in which the size ratio of the transistor Tr4 (Tr5, Tr6) in the V scanner block 14 is in the range from about 6% to about 15% of the size ratio of the transistor Tr1. As a result, it is found that the operating frequency and the life are improved from those of the comparative example. That is, it is found that the operating frequency and the life are improved from those of the comparative example by setting the size ratio of the transistor Tr4 (Tr5, Tr6) in the V scanner block 14 of the first embodiment smaller than the size ratio of the transistor Tr4 (Tr5, Tr6) in the V scanner block 14 of the comparative example similarly to the above-described case in which the magnitude of the size ratio of the transistor Tr7 in the V scanner block 14 of the first embodiment is changed with respect to the magnitude of the size ratio of the transistor Tr1. Furthermore, it is confirmed that, when the size ratio of the transistor Tr4 (Tr5, Tr6) is in the range from about 3% to about 5% (optimum range), the superiority over the comparative example in the operating frequency and the life is the largest.

Next, with reference to FIG. 1 to FIG. 3 and FIG. 6, the operation of the above-described scanning line drive circuit 6 (V scanner block 14) will be described below.

First, for the V scanner block 14 (see FIG. 2) of the first line of the scanning line drive circuit 6, in time A shown in FIG. 6 (CLK1 is at the L level and CLK2 is at the H level), the STV signal at the H level shown in FIG. 3 is input to the gate (G) of the transistor Tr7, and thereby the transistor Tr7 enters the on-state. This makes the H-level signal be input via a node N1 to the gate (G) of the transistor Tr1, the gate (G) of the transistor Tr4, the drain (D) of the transistor Tr7, the source (S) of the transistor Tr6, and the other electrode of the capacitor C2. As a result, the transistor Tr1 and the transistor Tr4 become the on-state. The potential of a node N2 becomes the L-level potential. The potential of the other electrode of the capacitor C2 becomes the H level, and charge of the capacitor C2 is started. Because the CLK2 signal at the H level is input to the gate (G) of the transistor Tr3, the transistor Tr3 enters the on-state. The gate line 9 is connected to the VBB potential at the L level via the OUT terminal and the transistor Tr3.

Next, for the V scanner block 14 (see FIG. 2) of the first line of the scanning line drive circuit 6, in time B shown in FIG. 6 (CLK1 is at the H level and CLK2 is at the L level), the STV signal at the L level shown in FIG. 3 is input to the gate (G) of the transistor Tr7, and thereby the transistor Tr7 enters the off-state. At this time, the H-level potential is discharged from the capacitor C2 charged in the above-described time A, and the H-level signal is input to the gate (G) of the transistor Tr1 and the gate (G) of the transistor Tr4. This makes the transistor Tr1 and the transistor Tr4 enter the on-state. Thus, the CLK1 signal at the H level is output from the OUT terminal to the gate line 9 via the transistor Tr1. Thereby, the output signal makes the thin film transistor 10 provided in the pixel 3 in the display unit 4 be driven. In addition, the signal output to the OUT terminal is input to the SET terminal of the V scanner block 14 of the next stage. Furthermore, the L-level signal (VBB potential) is input to the gate (G) of the transistor Tr2 and the gate (G) of the transistor Tr6 via the transistor Tr4 and the node N2. Thus, the transistor Tr2 and the transistor Tr6 become the off-state.

Next, for the V scanner block 14 (see FIG. 2) of the first line of the scanning line drive circuit 6, in time C shown in FIG. 6 (CLK1 is at the L level and CLK2 is at the H level), the STV signal at the L level shown in FIG. 3 is input to the gate (G) of the transistor Tr7, and therefore the transistor Tr7 enters the off-state. The CLK1 signal at the L level is input to the source (S) of the transistor Tr1. The CLK2 signal at the H level is input to the gate (G) of the transistor Tr3, and thus the transistor Tr3 enters the on-state. Furthermore, the L-level signal (VBB potential) is output from the OUT terminal to the gate line 9 (see FIG. 1) via the transistor Tr3.

Furthermore, to the gate (G) of the transistor Tr5, the RESET signal at the H level output from the V scanner block 14 of the second line (next stage) is input. Therefore, the transistor Tr5 enters the on-state. Thus, the L-level signal (VBB potential) is input via the transistor Tr5 to the gate (G) of the transistor Tr1, the gate (G) of the transistor Tr4, the source (S) of the transistor Tr6, and the source (S) of the transistor Tr7. This makes the transistor Tr1 and the transistor Tr4 enter the off-state. In addition, the CLK2 signal at the H level is input to the gate (G) of the transistor Tr3, and thus the transistor Tr3 becomes the on-state. Thus, the L-level signal (VBB potential) is output from the OUT terminal via the transistor Tr3. The details of the scanning operation of the second line and the subsequent lines are the same as the above-described details of the scanning operation of the first line.

In the first embodiment, as described above, the magnitude of the size ratio (W/L) obtained by dividing the channel width W of the transistor Tr7 by the channel length L thereof is set in the range from 15% to 30% of the magnitude of the size ratio (W/L) obtained by dividing the channel width W of the transistor Tr1 by the channel length L thereof. Thereby, compared with the case in which the magnitude of the size ratio (W/L) of the transistor Tr7 is smaller than 15% of the magnitude of the size ratio (W/L) of the transistor Tr1 (comparative example), the magnitude of the signal output from the source (S) of the transistor Tr7 can be increased in association with the larger magnitude of the size ratio (W/L) of the transistor Tr7. Thus, the time necessary for charge/discharge of the parasitic capacitor between the source (S) of the transistor Tr7 and the gate (G) of the transistor Tr1 can be shortened. Due to this feature, the operating performance of the V scanner block 14 can be enhanced through adjustment of the size ratio (W/L) of the transistor. It is known that, if a thin film transistor utilizing amorphous silicon is used as the transistor element as described above, this kind of circuit involves a comparatively-short operation limit, i.e. a comparatively-short life because of a phenomenon in which element characteristics are deteriorated attributed to voltage stress applied in circuit operation and the use temperature environment. Against this problem, the adjustment of the size ratio of the transistor in the embodiment enhances the operating performance and simultaneously extends the time until reaching to the operation limit under the same voltage stress and use temperature environment. Furthermore, also for a polycrystalline or single-crystalline silicon element, which is considered to be comparatively robust against voltage stress compared with the amorphous silicon element, by setting the size ratio (W/L) of the transistor Tr7 in the V scanner block 14 in the scanning line drive circuit 6 of the first embodiment larger than the size ratio (W/L) of the transistor Tr7 in the V scanner block 14 in the scanning line drive circuit 6 of the comparative example, field crowding between the source and drain of the transistor Tr7 can be suppressed in association with the larger size (area) of the transistor Tr7. Thus, characteristic deterioration attributed to field crowding in the transistor Tr7 can be suppressed. That is, the life of the V scanner block 14 can be extended by the comprehensive effects of these features.

Furthermore, in the first embodiment, the operating performance of the V scanner block 14 can be further enhanced by setting the magnitude of the size ratio (W/L) obtained by dividing the channel width W of the transistor Tr7 by the channel length L thereof to magnitude in the range from 20% to 25% of the magnitude of the size ratio (W/L) obtained by dividing the channel width W of the transistor Tr1 by the channel length L thereof as described above.

In addition, in the first embodiment, the magnitude of the size ratio (W/L) obtained by dividing the channel width W of the transistors Tr4, Tr5, and Tr6 by the channel length L thereof may be set smaller than the magnitude of the size ratio (W/L) obtained by dividing the channel width W of the transistor Tr7 by the channel length L thereof and be set in the range from 2.5% to 6% of the magnitude of the size ratio (W/L) obtained by dividing the channel width W of the transistor Tr1 by the channel length L thereof as described above. When this configuration is employed, compared with the case in which the magnitude of the size ratio (W/L) of the transistors Tr4, Tr5, and Tr6 is larger than 6% of the magnitude of the size ratio (W/L) of the transistor Tr1 (comparative example), the time necessary for charge/discharge of the parasitic capacitor of the transistors Tr4, Tr5, and Tr6 can be shortened in association with the smaller magnitude of the size ratio (W/L) of the transistors Tr4, Tr5, and Tr6. Thus, the operating performance of the V scanner block 14 can be enhanced.

Moreover, in the first embodiment, the magnitude of the size ratio (W/L) of each of the plural transistors Tr4, Tr5, and Tr6, obtained by dividing the channel width W of a respective one of the plural transistors Tr4, Tr5, and Tr6 by the channel length L thereof, may be set smaller than the magnitude of the size ratio (W/L) obtained by dividing the channel width W of the transistor Tr7 by the channel length L thereof and be set in the range from 2.5% to 6% of the magnitude of the size ratio (W/L) obtained by dividing the channel width W of the transistor Tr1 by the channel length L thereof as described above. When this configuration is employed, also in the case in which the plural transistors are provided, the time necessary for charge/discharge of the parasitic capacitor of each of the plural transistors Tr4, Tr5, and Tr6 can be shortened, and thus the operating performance of the V scanner block 14 can be enhanced.

Furthermore, in the first embodiment, the operating performance of the V scanner block 14 can be further enhanced by setting the magnitude of the size ratio (W/L) obtained by dividing the channel width W of the transistors Tr4, Tr5, and Tr6 by the channel length L thereof to magnitude in the range from 3.0% to 5.0% of the magnitude of the size ratio (W/L) obtained by dividing the channel width W of the transistor Tr1 by the channel length L thereof as described above.

In addition, in the first embodiment, the output signal of the V scanner block 14 provided at the previous stage is input to the drain (D) of the transistor Tr7 and the gate (G) of the transistor Tr7 as described above. Thereby, due to the input of the output signal (H-level signal) of the V scanner block 14 provided at the previous stage to the gate (G) of the transistor Tr7, the transistor Tr7 can be set to the on-state and the H-level signal can be output from the source (S) of the transistor Tr7.

Moreover, in the first embodiment, the transistor Tr1 and the transistor Tr7 have an active layer formed of amorphous silicon as described above. Thus, the operating performance of the V scanner block 14 including the transistor Tr1 and the transistor Tr7 having the active layer formed of amorphous silicon, which is susceptible to performance deterioration, can be enhanced.

Second Embodiment

Next, with reference to FIG. 1 and FIG. 7 to FIG. 9, a description will be made below about an example in which a V scanner block 14a is configured by six transistors (transistors Tr11, Tr12, Tr13, Tr14, Tr15, and Tr16) and one capacitor (C11) differently from the above-described first embodiment, in which the V scanner block 14 is configured by seven transistors and two capacitors. The transistor Tr11 is one example of the "first transistor" of the embodiments of the present application. The transistor Tr16 is one example of the "second transistor" of the embodiments of the present application. The transistor Tr15 is one example of the "third transistor" of the embodiments of the present application.

As shown in FIG. 7, in the V scanner block 14a in a liquid crystal display device 100a of this second embodiment, the source (S) of the transistor Tr11 is connected to the CLK1 terminal and a pulse clock signal is input thereto. The drain (D) of the transistor Tr11 is connected to the gate line 9 (see FIG. 1) and capable of outputting a signal to the thin film transistor 10 provided in the pixel 3. Furthermore, the drain (D) of the transistor Tr11 is connected to the source (S) of the transistor Tr12 and one electrode of the capacitor C11. The gate (G) of the transistor Tr11 is connected to the source (S) of the transistor Tr15 and the source (S) of the transistor Tr16 via a node N3, and connected to the other electrode of the capacitor C11.

The drain (D) of the transistor Tr12 is connected to the source (S) of the transistor Tr14, the drain (D) of the transistor Tr15, and the VBB terminal. The gate (G) of the transistor Tr12 is connected to the source (S) of the transistor Tr13, the drain (D) of the transistor Tr14, and the gate (G) of the transistor Tr15. The drain (D) and gate (G) of the transistor Tr13 are connected to the CLK2 terminal and the pulse CLK2 signal (clock signal) as the inverted signal of the CLK1 signal is input thereto.

The gate (G) of the transistor Tr14 is connected to the gate (G) of the transistor Tr16, the drain (D) of the transistor Tr16, and the SET terminal. The SET signal is input to the gate (G) of the transistor Tr14, the gate (G) of the transistor Tr16, and the drain (D) of the transistor Tr16.

Next, with reference to FIG. 8 and FIG. 9, a description will be made below about simulation on the upper limit of the operating frequency of the V scanner block in the case in which the magnitude of the size ratio (W/L) of the transistor Tr16 in the V scanner block of the second embodiment is changed from that in a comparative example. In the V scanner block 14*a* of the comparative example and the second embodiment, the magnitude of the size ratio (W/L) obtained by dividing the channel width W of the transistor Tr11 by the channel length L thereof is defined as 100% (base). The channel width W of the transistor Tr11 in the V scanner block 14*a* of the comparative example and the second embodiment is about 2 mm (2000 μm), and the channel length L thereof is about 4 μm. Furthermore, the size ratio of the transistor Tr16 in the V scanner block 14*a* of the comparative example is set in the range from about 6% to about 15% of the size ratio of the transistor Tr11, and the size ratio of the transistor Tr16 in the V scanner block 14*a* of the second embodiment to the transistor Tr11 is set in the range from about 15% to about 30%. In addition, as shown in FIG. 9, the same size ratios as those of the comparative example are set for the transistors Tr12 to Tr15 of the second embodiment. Specifically, the size ratio of the transistor Tr12 is set in the range from about 22% to about 37%. The size ratio of the transistor Tr13 is set in the range from about 1% to about 10%. The size ratio of the transistors Tr14 and Tr15 is set in the range from about 6% to about 15%.

Figure 8:
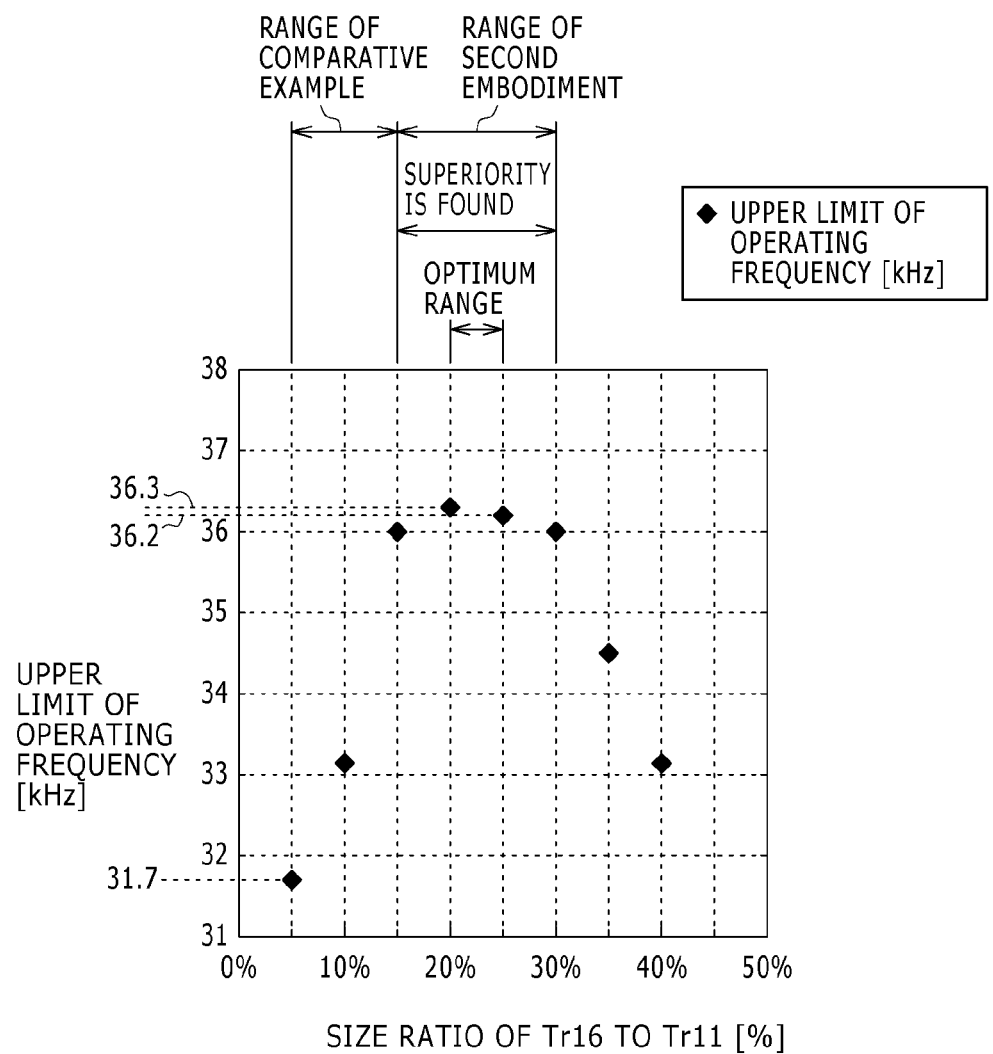
FIG. 8 is a diagram showing the upper limit of the operating frequency when the size ratio (W/L) of a transistor in the V scanner block of the second embodiment and a comparative example is changed.
Figures 9, 10:
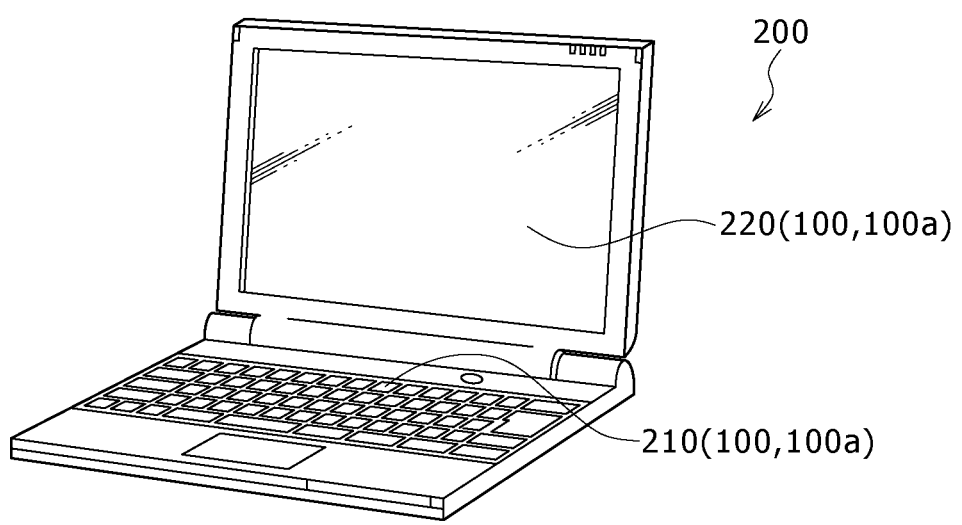
FIG. 9 is a table showing the size ratios (W/L) of the respective transistors in the V scanner block of the second embodiment and the comparative example.
FIG. 10 is a diagram for explaining a first example of electronic apparatus in which the liquid crystal display devices of the first and second embodiments are used.

In FIG. 8, the abscissa indicates the size ratio of the transistor Tr16 to the transistor Tr11 [%]. As shown in FIG. 8, it is found that, when the size ratio of the transistor Tr16 in the V scanner block 14*a* is in the range from about 6% to about 15% (range of the comparative example), the upper limit of the operating frequency is in the range from about 31.7 kHz to about 36 kHz.

In contrast, it is found that, when the size ratio of the transistor Tr16 in the V scanner block 14*a* is in the range from about 15% to about 30% (range of the second embodiment), the upper limit of the operating frequency is in the range from about 36 kHz to about 36.3 kHz. That is, it is confirmed that the upper limit of the operating frequency can be enhanced compared with the V scanner block 14*a* of the comparative example by setting the size ratio of the transistor Tr16 in the V scanner block 14*a* in the range from about 15% to about 30%. Moreover, it is found that, when the size ratio of the transistor Tr16 in the V scanner block 14*a* of the second embodiment is in the range from about 20% to about 25% (optimum range), the upper limit of the operating frequency is in the range from about 36.2 kHz to about 36.3 kHz. That is, it is confirmed that the superiority over the comparative example in the operating frequency is large when the size ratio is in the range from about 20% to about 25% within the range from about 15% to about 30%, which is the range of the size ratio of the transistor Tr16 in the V scanner block 14*a* of the second embodiment. As for the transistors Tr12 to Tr15, simulation in which the size ratio is changed from that in the comparative example was not carried out.

In the second embodiment, as described above, the magnitude of the size ratio (W/L) obtained by dividing the channel width W of the transistor Tr16 by the channel length L thereof is set in the range from 15% to 30% of the magnitude of the size ratio (W/L) obtained by dividing the channel width W of the transistor Tr11 by the channel length L thereof. Due to this adjustment of the size ratio (W/L) of the transistor, compared with the case shown as the comparative example, in which the magnitude of the size ratio (W/L) of the transistor Tr16 is smaller than 15% of the magnitude of the size ratio (W/L) of the transistor Tr11, the magnitude of the signal output from the source (S) of the transistor Tr16 can be increased in association with the larger magnitude of the size ratio (W/L) of the transistor Tr16. Thus, the time necessary for charge/discharge of the parasitic capacitor between the source (S) of the transistor Tr16 and the gate (G) of the transistor Tr11 can be shortened. This can enhance the operating performance of the V scanner block 14*a*.

The other advantageous effects of the second embodiment are the same as those by the above-described first embodiment.

Application Examples

Figure 11:
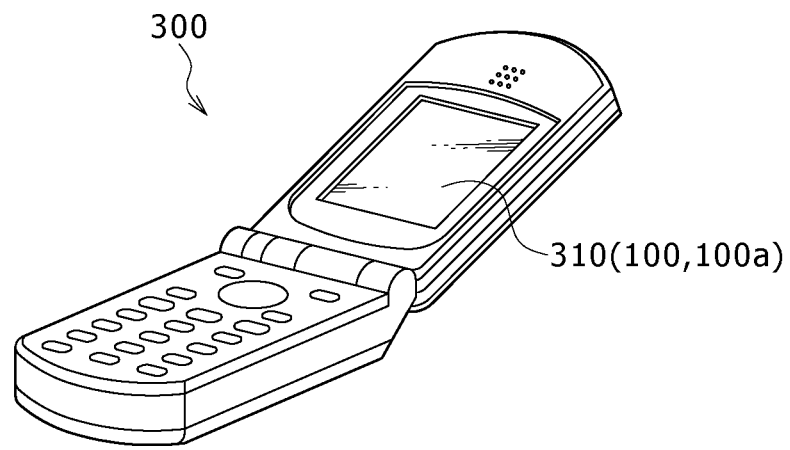
FIG. 11 is a diagram for explaining a second example of the electronic apparatus in which the liquid crystal display devices of the first and second embodiments are used.
Figure 12:
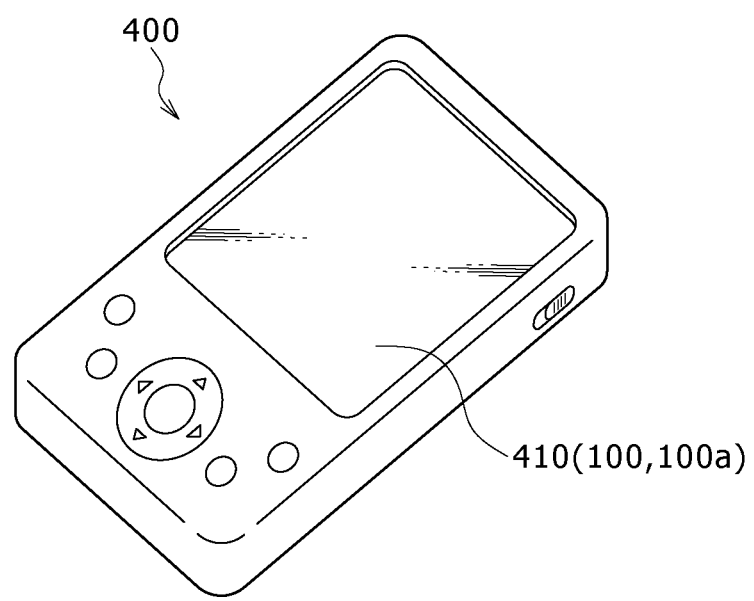
FIG. 12 is a diagram for explaining a third example of the electronic apparatus in which the liquid crystal display devices of the first and second embodiments are used.

FIG. 10 to FIG. 12 are diagrams for explaining a first example to a third example, respectively, of electronic apparatus in which the liquid crystal display devices 100 and 100*a* of the above-described embodiments of the present application are used. With reference to FIG. 10 to FIG. 12, a description will be made below about the electronic apparatus in which the liquid crystal display devices 100 and 100*a* of the embodiments of the present application are used.

The liquid crystal display devices 100 and 100*a* of the embodiments of the present application can be used for a personal computer (PC) 200 as the first example, a cellular phone 300 as the second example, an information portable terminal (personal digital assistant (PDA)) 400 as the third example, etc. as shown in FIG. 10 to FIG. 12.

In the PC 200 of the first example of FIG. 10, the liquid crystal display devices 100 and 100*a* of the embodiments of the present application can be used for an input unit 210 such as a keyboard, a display screen 220, and so forth. In the cellular phone 300 of the second example of FIG. 11, the liquid crystal display devices 100 and 100*a* of the embodiments of the present application are used for a display screen 310. In the information portable terminal 400 of the third example of FIG. 12, the liquid crystal display devices 100 and 100*a* of the embodiments of the present application are used for a display screen 410.

The embodiments disclosed in the present specification should be considered as examples and being not limiting entities in all points. The scope of the present application is indicated by not the above description of the embodiments but the scope of the claims, and encompasses all changes in the sense of being equivalent to the scope of the claims and within the scope of the claims.

For example, in the above-described first and second embodiments, a liquid crystal display device is used as one example of the embodiments of the display device of the present application. However, the present application is not limited thereto. For example, a display device other than the liquid crystal display device, such as an organic EL device, may be used as the display device of the embodiments of the present application.

Furthermore, in the above-described first and second embodiments, a scanning line drive circuit unit configured by seven transistors (transistors Tr1 to Tr7) and a scanning line drive circuit unit configured by six transistors (transistors Tr11 to Tr16) are shown as one example of the scanning line drive circuit unit of the embodiments of the present application. However, the present application is not limited thereto. In the present application, the scanning line drive circuit unit may be configured by five or less transistors or eight or more transistors.

In addition, in the above-described first and second embodiments, as one example of the size of the transistors Tr1 and Tr11, the channel width W is set to about 2 mm (2000 μm) and the channel length L is set to about 4 μm. However, the present application is not limited thereto. In the present application, the channel width W of the transistors Tr1 and Tr11 may be set to a width other than about 2 mm (2000 μm), and the channel length L of the transistors Tr1 and Tr11 may be set to a length other than about 4 μm.

Moreover, in the above-described first and second embodiments, scanning line drive circuits to which transistors having an active layer formed of amorphous silicon are applied are shown as one example of the scanning line drive circuit of the embodiments of the present application. However, the present application is not limited thereto. For example, transistors having an active layer formed of low-temperature poly-silicon (LTPS) or high-temperature poly-silicon (HTPS) may be applied to the scanning line drive circuit.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A display device comprising:
a switching element formed for each of a plurality of pixels;
a gate line connected to the switching element; and
a scanning line drive circuit connected to the gate line, wherein
the scanning line drive circuit includes scanning line drive circuit units of a plurality of stages,
the scanning line drive circuit unit includes a first transistor and a second transistor, one of source and drain of the first transistor being connected to the gate line, an output signal of the scanning line drive circuit unit provided at a previous stage being input to one of source and drain of the second transistor, the other of the source and drain of the second transistor being connected to a gate of the first transistor, and
a magnitude of a size ratio obtained by dividing a channel width of the second transistor by a channel length of the second transistor is in a range from 20% to 25% of a magnitude of a size ratio obtained by dividing a channel width of the first transistor by a channel length of the first transistor,
wherein an upper limit of an operating frequency of the scanning line drive circuit is in a range from 29.5 kHz to 30 kHz.

2. The display device according to claim 1, wherein
the scanning line drive circuit unit further includes a third transistor connected to the gate of the first transistor and the other of the source and drain of the second transistor, and
a magnitude of a size ratio obtained by dividing a channel width of the third transistor by a channel length of the third transistor is smaller than the magnitude of the size ratio obtained by dividing the channel width of the second transistor by the channel length of the second transistor, and is in a range from 2.5% to 6% of the magnitude of the size ratio obtained by dividing the channel width of the first transistor by the channel length of the first transistor.

3. The display device according to claim 1, wherein
the scanning line drive circuit unit further includes a plurality of third transistors connected to the gate of the first transistor and the other of the source and drain of the second transistor, and
a magnitude of a size ratio of each of the plurality of third transistors, obtained by dividing a channel width of a respective one of the third transistors by a channel length of the respective one of the third transistors, is smaller than the magnitude of the size ratio obtained by dividing the channel width of the second transistor by the channel length of the second transistor, and is in a range from 2.5% to 6% of the magnitude of the size ratio obtained by dividing the channel width of the first transistor by the channel length of the first transistor.

4. The display device according to claim 2, wherein
the magnitude of the size ratio obtained by dividing the channel width of the third transistor by the channel length of the third transistor is in a range from 3.0% to 5.0% of the magnitude of the size ratio obtained by dividing the channel width of the first transistor by the channel length of the first transistor.

5. The display device according to claim 1, wherein
the output signal of the scanning line drive circuit unit provided at the previous stage is input to one of the source and drain of the second transistor and a gate of the second transistor.

6. The display device according to claim 1, wherein
the first transistor and the second transistor have an active layer formed of amorphous silicon.

7. An electronic apparatus comprising:
a display device, the display device including:
a switching element formed for each of a plurality of pixels;
a gate line connected to the switching element; and
a scanning line drive circuit connected to the gate line,
wherein the scanning line drive circuit includes scanning line drive circuit units of a plurality of stages,
wherein the scanning line drive circuit unit includes a first transistor and a second transistor, one of source and drain of the first transistor being connected to the gate line, an output signal of the scanning line drive circuit unit provided at a previous stage being input to one of source and drain of the second transistor, the other of the source and drain of the second transistor being connected to a gate of the first transistor, and
wherein a magnitude of a size ratio obtained by dividing a channel width of the second transistor by a channel length of the second transistor is in a range from 20% to 25% of a magnitude of a size ratio obtained by dividing a channel width of the first transistor by a channel length of the first transistor,
wherein an upper limit of an operating frequency of the scanning line drive circuit is in a range from 29.5 kHz to 30 kHz.

* * * * *